US012583469B2

(12) United States Patent
Yang

(10) Patent No.: US 12,583,469 B2
(45) Date of Patent: Mar. 24, 2026

(54) HYBRID SIMULATION SYSTEM FOR AUTONOMOUS VEHICLES

(71) Applicant: TUSIMPLE, INC., San Diego, CA (US)

(72) Inventor: Yixin Yang, San Diego, CA (US)

(73) Assignee: CreateAI, Inc., San Diego, CA (US)

( * ) Notice: Subject to any disclaimer, the term of this patent is extended or adjusted under 35 U.S.C. 154(b) by 210 days.

(21) Appl. No.: 18/479,711

(22) Filed: Oct. 2, 2023

(65) Prior Publication Data

US 2024/0025426 A1 Jan. 25, 2024

Related U.S. Application Data

(63) Continuation of application No. 17/555,069, filed on Dec. 17, 2021, now Pat. No. 11,834,057, which is a
(Continued)

(51) Int. Cl.
*B60W 50/04* (2006.01)
*B60W 10/02* (2006.01)
(Continued)

(52) U.S. Cl.
CPC .......... *B60W 50/045* (2013.01); *B60W 10/02* (2013.01); *B60W 10/04* (2013.01);
(Continued)

(58) Field of Classification Search
CPC .... B60W 50/045; B60W 10/02; B60W 10/04; B60W 10/10; B60W 10/18; B60W 10/20;
(Continued)

(56) References Cited

U.S. PATENT DOCUMENTS 1,094,341 A 4/1914 Mills et al.
9,836,895 B1 * 12/2017 Nygaard .............. G07C 5/0841
(Continued)

FOREIGN PATENT DOCUMENTS

AU 2018267541 A1 6/2019
CN 105759789 A 7/2016
CN 109211574 A 1/2019

OTHER PUBLICATIONS

Australian Patent Office, Examination Report No. 1 for AU Appl. No. 2020203249, mailed on Nov. 22, 2024, 4 pages.
(Continued)

*Primary Examiner* — Brian P Sweeney
(74) *Attorney, Agent, or Firm* — Perkins Coie LLP

(57) ABSTRACT

Techniques are disclosed for performing hybrid simulation operations with an autonomous vehicle. A method of testing autonomous vehicle operations includes receiving, by a computer, a pre-configured scenario that includes one or more simulation parameters and one or more initial condition parameters, sending, to the autonomous vehicle and based on the one or more initial condition parameters, control signals that instruct the autonomous vehicle to operate at an operative condition, and in response to determining that the autonomous vehicle is operating at the operative condition, performing a simulation with the one or more simulated objects and the autonomous vehicle to test a response of the autonomous vehicle.

20 Claims, 4 Drawing Sheets

Related U.S. Application Data continuation of application No. 16/428,805, filed on May 31, 2019, now Pat. No. 11,208,113.

(51) Int. Cl.

| | |
|---|---|
| *B60W 10/04* | (2006.01) |
| *B60W 10/10* | (2012.01) |
| *B60W 10/18* | (2012.01) |
| *B60W 10/20* | (2006.01) |
| *B60W 30/18* | (2012.01) |
| *G05D 1/00* | (2024.01) |
| *G06F 30/20* | (2020.01) |
| *B60W 50/00* | (2006.01) |

(52) U.S. Cl.
CPC ........... *B60W 10/10* (2013.01); *B60W 10/18* (2013.01); *B60W 10/20* (2013.01); *B60W 30/18* (2013.01); *G05D 1/0088* (2013.01); *G06F 30/20* (2020.01); *B60W 2050/0028* (2013.01); *B60W 2300/147* (2024.01); *B60W 2520/105* (2013.01); *B60W 2556/00* (2020.02); *B60W 2710/02* (2013.01); *B60W 2710/0605* (2013.01); *B60W 2710/10* (2013.01); *B60W 2710/18* (2013.01); *B60W 2710/20* (2013.01)

(58) Field of Classification Search
CPC ......... B60W 30/18; B60W 2050/0028; B60W 2300/147; B60W 2520/105; B60W 2556/00; B60W 2710/02; B60W 2710/0605; B60W 2710/10; B60W 2710/18; B60W 2710/20; G05D 1/0088; G06F 30/20; G01M 17/007; G05B 23/0213
See application file for complete search history.

(56) References Cited

U.S. PATENT DOCUMENTS

| | | | | |
|---|---|---|---|---|
| 11,208,113 | B2 | 12/2021 | Yang | |
| 11,940,793 | B1 * | 3/2024 | Kavalar | ............... B60W 60/00 |
| 2019/0009789 | A1 | 1/2019 | Zhang | |
| 2020/0377109 | A1 | 12/2020 | Yang | |
| 2022/0105950 | A1 | 4/2022 | Yang | |

OTHER PUBLICATIONS

Notice of matters affecting validity of standard patents for Australian Patent Application No. 2020203249, submitted Sep. 4, 2021 (7 pages).

Third Party Observation for European Patent Application No. 20176708.4 submitted Sep. 4, 2021 (4 pages).

Extended European Search Report for European Patent Application No. 20176708.4, mailed Oct. 12, 2020.

Bock, T. et al., Vehicle in the Loop, XP055734839, Retrieved from the Internet: URL:https://link.springer.com/ contenl/pdf/10.1007/BF03221943.pdf.

Chinese Patent Office, Search Report for Appl. No. 202010482036.3, mailed on Jun. 12, 2023, 2 pages.

Chinese Patent Office, 1st Office Action for Appl. No. 202010482036.3, mailed on Jun. 14, 2023, 6 pages.

* cited by examiner

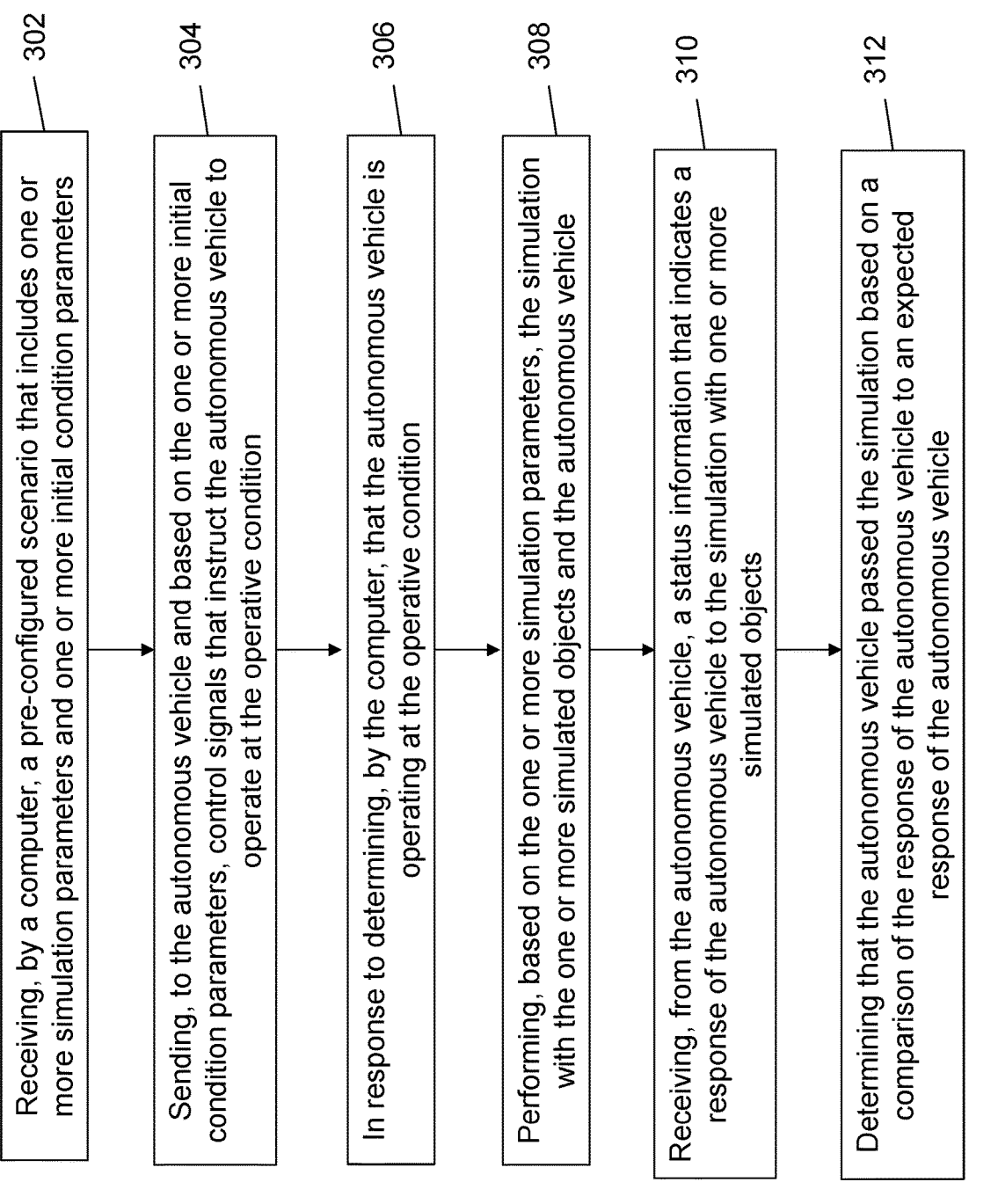

Receiving, by a computer, a pre-configured scenario that includes one or more simulation parameters and one or more initial condition parameters ⟍ 302

Sending, to the autonomous vehicle and based on the one or more initial condition parameters, control signals that instruct the autonomous vehicle to operate at the operative condition ⟍ 304

In response to determining, by the computer, that the autonomous vehicle is operating at the operative condition ⟍ 306

Performing, based on the one or more simulation parameters, the simulation with the one or more simulated objects and the autonomous vehicle ⟍ 308

Receiving, from the autonomous vehicle, a status information that indicates a response of the autonomous vehicle to the simulation with one or more simulated objects ⟍ 310

Determining that the autonomous vehicle passed the simulation based on a comparison of the response of the autonomous vehicle to an expected response of the autonomous vehicle ⟍ 312

FIG. 3

HYBRID SIMULATION SYSTEM FOR AUTONOMOUS VEHICLES

CROSS-REFERENCE TO RELATED APPLICATIONS

This application is a continuation of U.S. patent application Ser. No. 17/555,069, filed on Dec. 17, 2021, which is a continuation of U.S. patent application Ser. No. 16/428,805, filed on May 31, 2019, now U.S. Pat. No. 11,208,113. The aforementioned applications are incorporated herein by reference in their entireties.

TECHNICAL FIELD

This document relates to techniques to perform simulations on an autonomous vehicle.

BACKGROUND

A vehicle may include sensors for several purposes. For example, sensors may be attached to the front and rear bumpers of a car to provide audible and/or visual cues to the driver to indicate a proximity of an object to the car. In another example, sensors may be installed on a roof of a vehicle to facilitate autonomous driving. Sensors can obtain data related to one or more areas that surround a vehicle. The sensor data can be processed to obtain information about the road or about the objects surrounding the autonomous vehicle. Thus, the sensor data obtained from the sensors on an autonomous vehicle can be used to safely maneuver the autonomous vehicle through traffic or on a highway.

SUMMARY

A hybrid simulation system includes a vehicle simulation computer operating in an autonomous vehicle to test the operations and/or performance of the autonomous vehicle under pre-configured scenarios. The hybrid simulation system can allow a user to test an autonomous vehicle by running a pre-configured scenario on an actual autonomous vehicle that can operate in a test facility in the real-world.

In an exemplary embodiment, a method enables testing of autonomous vehicle operations. The method includes receiving, by a computer, a pre-configured scenario that includes: one or more simulation parameters that indicate presence of one or more simulated objects in an environment that includes an autonomous vehicle, and one or more initial condition parameters that indicate an operative condition in which the autonomous vehicle is to be operated when a simulation is performed to test the autonomous vehicle. The method includes sending, to the autonomous vehicle and based on the one or more initial condition parameters, control signals that instruct the autonomous vehicle to operate at the operative condition. The method also includes in response to determining, by the computer, that the autonomous vehicle is operating at the operative condition: performing, based on the one or more simulation parameters, the simulation with the one or more simulated objects and the autonomous vehicle; receiving, from the autonomous vehicle, a status information that indicates a response of the autonomous vehicle to the simulation with one or more simulated objects; and determining that the autonomous vehicle passed the simulation based on a comparison of the response of the autonomous vehicle to an expected response of the autonomous vehicle.

In some embodiments, the computer determines that the autonomous vehicle is operating at the operative condition by: receiving, from the autonomous vehicle, another status information that indicates a current driving condition of the autonomous vehicle; and determining that that the current driving condition is same as the operative condition. In some embodiments, the method further comprises resending the control signals to the autonomous vehicle in response to determining that the autonomous vehicle is not operating at the operative condition.

In some embodiments, the one or more simulation parameters that indicate presence of the one or more simulated objects include a first set of one or more locations of one or more vehicles or a second set of one or more locations of one or more pedestrians. In some embodiments, the one or more initial condition parameters include a position, a rotation, a speed, or an acceleration of the autonomous vehicle. In some embodiments, the control signals include a steering angle that controls an amount of steering of the autonomous vehicle, a throttle value that controls a speed of the autonomous vehicle, a brake value to control an amount of braking engaged by the autonomous vehicle, a clutch indication to press or release the clutch of the autonomous vehicle, or a gear shifting information to switch engine gears of the autonomous vehicle. In some embodiments, the autonomous vehicle is a semi-trailer truck.

In yet another exemplary aspect, the above-described method is embodied in the form of processor-executable code and stored in a computer-readable program medium. A computer readable program storage medium can have code stored thereon, where the code, when executed by a processor, causes the processor to implement the methods described in this patent document.

In yet another exemplary embodiment, a device or apparatus that is configured or operable to perform the above-described methods is disclosed.

In yet another exemplary aspect, a system for testing autonomous vehicle operation is described. The system includes an autonomous vehicle and a computer that includes a processor and a memory that stores instructions. The instruction when executed by the processor, causes the processor to implement the methods described in this patent document.

The above and other aspects and their implementations are described in greater detail in the drawings, the descriptions, and the claims.

BRIEF DESCRIPTION OF THE DRAWINGS

FIG. 3 shows an exemplary flow diagram for testing autonomous vehicle operations.

DETAILED DESCRIPTION

Figure 1:
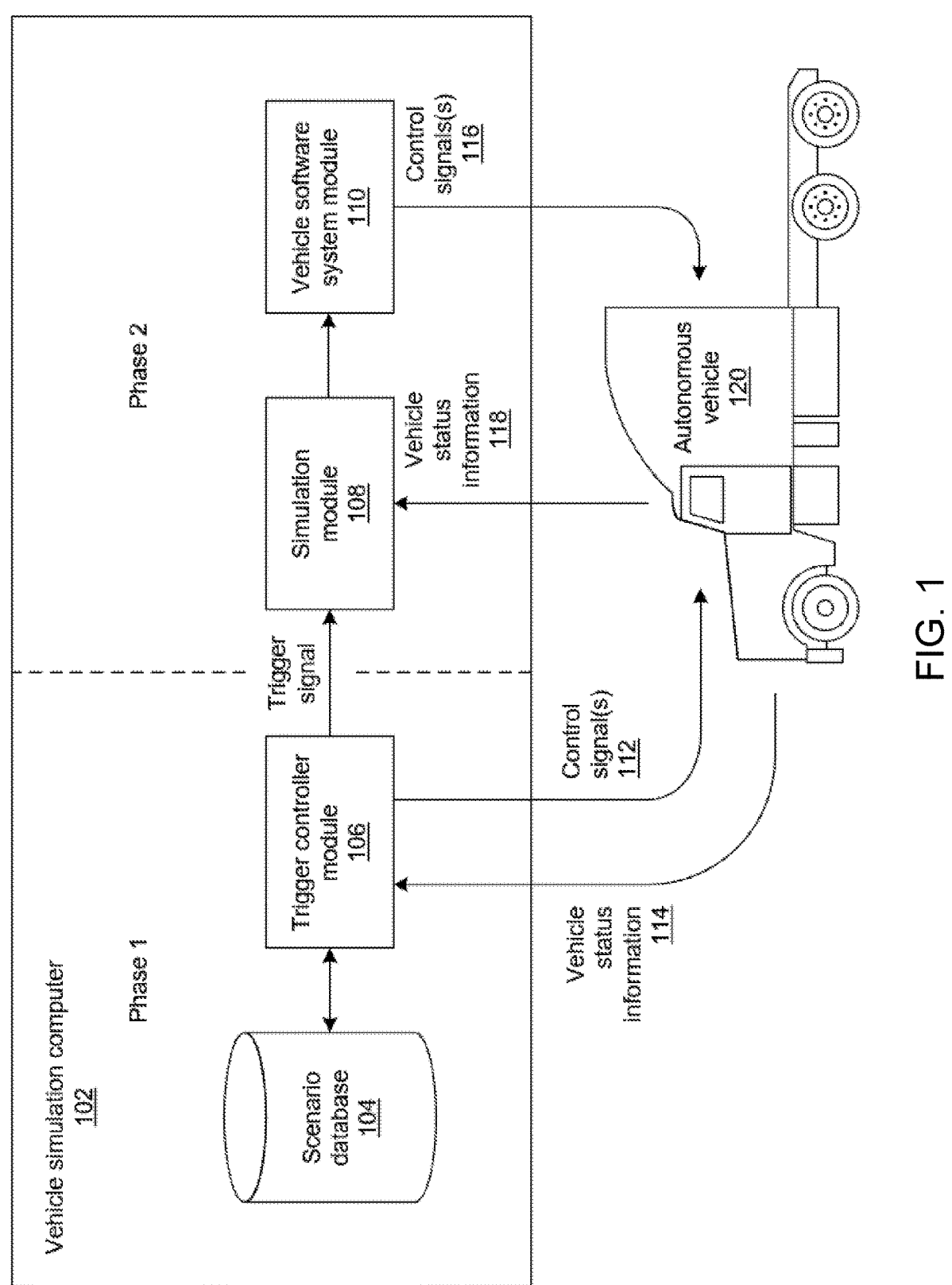
FIG. 1 shows a block diagram of an exemplary hybrid simulation system.

A driving system operating in an autonomous vehicle is a complex system that involves not only hardware but also software. The software system operating in an autonomous vehicle includes algorithm modules that can perform various autonomous driving related operations based on information obtained from the hardware on the autonomous vehicle. For example, a perception algorithm module can detect vehicle and/or objects located around the autonomous vehicle based on data obtained from sensors located on the autonomous vehicle. In another example, a control algorithm module can control the driving operation of the autonomous vehicle in response to the information generated by the perception module. The integration of hardware and software should be tested under various scenarios to determine that the overall autonomous driving system performs safely under various scenarios.

A conventional simulation system includes a computer that executes a simulation to test an autonomous vehicle's software system. The conventional simulation computer provides mock sensor information to the autonomous vehicle's software system that is also operated on the simulation computer. Based on the mock sensor information, the software system's algorithm modules can generate output(s) that can be analyzed by the conventional simulation computer. The outputs obtained by the conventional simulation system can be used to simulate the process updating the status of the autonomous vehicle and/or other objects that surround the autonomous vehicle without actually using an autonomous vehicle. Thus, conventional simulation systems simulate the operations and/or performance of an autonomous vehicle without actually using an autonomous vehicle.

A conventional simulation system has several drawbacks. A conventional simulation system simulates in software the operations of the autonomous vehicle. However, the performance of an autonomous vehicle's hardware device can be difficult to simulate at least because the performance of the autonomous vehicle in response to control signals (e.g., steering, throttle) can be difficult to predict. Thus, in some cases, a conventional simulation system can indicate that an autonomous vehicle's software system yields acceptable performance only to fail in a real-world scenario. Such cases can happen frequently where an autonomous vehicle is a semi-trailer truck that includes a complex hardware and/or mechanical system.

An exemplary hybrid simulation system is described in this patent document that includes a vehicle simulation computer operating in an autonomous vehicle to test the operations and/or performance of the autonomous vehicle under pre-configured scenarios. Unlike conventional simulation systems, the hybrid simulation system allows a user to test the autonomous vehicle by running a pre-configured scenario on an actual autonomous vehicle that can operate in a test facility in the real-world. The pre-configured scenario can simulate an environment that surrounds the actual autonomous vehicle (e.g., other simulated vehicles located at a pre-determined distance from the autonomous vehicle) so that the autonomous vehicle can actually respond to the simulated pre-configured scenario. Thus, the exemplary hybrid simulation system can allow an actual or real autonomous vehicle to be tested on a road on a test site.

FIG. 1 shows a block diagram of an exemplary hybrid simulation system 100. The hybrid simulation system includes an actual or real autonomous vehicle 120 and a vehicle simulation computer 102 that can be located in the autonomous vehicle 120. The vehicle simulation computer 102 can perform hybrid simulation related operations in two phases. In phase 1, a trigger controller module 106 of the vehicle simulation computer 102 loads or retrieves a pre-configured scenario from a plurality of pre-configured scenarios stored on a scenario database 104.

A pre-configured scenario may have one or more initial condition parameters that indicate an initial condition of the autonomous vehicle 120, one or more simulation parameters that indicate of a presence of one or more simulated objects (e.g., another vehicle, pedestrian, etc.,) in an environment surrounding the autonomous vehicle 120, and/or one or more expected output from the autonomous vehicle 120 to verify the performance of the autonomous vehicle 120. An initial condition of the autonomous vehicle 120 describes an operating condition or a driving condition of the autonomous vehicle 120 when a simulated test is to be performed. The initial condition can describe a detailed physical status of the autonomous vehicle 120. For example, the initial condition in a pre-configured scenario may describe the position, rotation, speed (linear and/or angular), and/or acceleration of the autonomous vehicle 120. In some embodiments, a pre-configured scenario may include parameters to test an acceleration and/or deceleration of the autonomous vehicle or it may include parameters to test the steering of the autonomous vehicle.

In some embodiments, a pre-configured scenario may not include one or more simulation parameters that indicate of a presence of one or more simulated objects around the autonomous vehicle 120 so that the pre-configured scenario can test only a performance of the autonomous vehicle 120. For example, a pre-configured scenario may include a pre-defined trajectory of the autonomous vehicle and the trigger controller module 106 and/or vehicle software system module 110 (as further described in this patent document) can receive the trajectory as input and then send to the autonomous vehicle 120 control signals (e.g., throttle information, brake amount information and/or steering angle information). By testing the autonomous vehicle 120 without other simulated vehicles, vehicle simulation computer 102 can test the response of the autonomous vehicle's hardware. Thus, the hardware of the autonomous vehicle 120 may be validated so that the autonomous vehicle 120 can be deployed in the real world. In some embodiments, a pre-configured scenario may include faults (e.g., audible indicator to indicate a detected emergency vehicle) to train a driver to take control of the autonomous vehicle.

After the trigger controller module 106 receives the pre-configured scenario, the trigger controller module 106 can start the autonomous vehicle 120 and can send control signal(s) 112 to the autonomous vehicle so that the autonomous vehicle can reach an initial condition or can operate at an initial condition as described in the pre-configured scenario. Some examples of control signal(s) 112 to control the autonomous vehicle 120 can include a steering angle that controls an amount of steering of the autonomous vehicle, a throttle value that controls a speed or acceleration of the autonomous vehicle, a brake value to control an amount of braking or deceleration engaged by the autonomous vehicle, a clutch indication to press or release the clutch of the autonomous vehicle, and/or a gear shifting information to switch engine gears of the autonomous vehicle.

The trigger controller module 106 can perform a closed loop operation to determine whether the autonomous vehicle 120 has reached an initial condition in the pre-configured scenario. For example, a pre-configured scenario may be designed to have an initial condition where the autonomous vehicle 210 reach a speed of 10 mph after which a simulated car located 50 meters in front of the autonomous vehicle 120 is stopped. In this example, the trigger controller module 106 can start the autonomous vehicle 120 and can provide control signal(s) 112 such as disengaging brakes, increasing throttle, engaging clutch, and/or shifting gears. The trigger controller module 106 can also receive vehicle status information 114 (e.g., current speed and/or location/position)

from the autonomous vehicle 120 to determine whether the control signal(s) 112 need to be adjusted or maintained.

The trigger controller module 106 can also receive the vehicle status information 114 to determine whether the autonomous vehicle 120 has reached the initial condition of the pre-configured scenario. For example, if the initial condition states that the autonomous vehicle should operate at 25 mph to perform a simulation, the trigger controller module 106 can receive the vehicle status information which includes the current speed of the and compares the current speed to the target speed of the initial condition to resend the control signal 112. In some embodiments, if the current speed is 10 mph, then the trigger controller module can determine the amount of throttle needed to reach 25 mph and the trigger controller module can send the updated throttle amount to the autonomous vehicle 120 as part of an updated resent control signal 112.

After the trigger controller module 106 determines that the autonomous vehicle 120 has reached an initial condition, the trigger controller module 106 sends a trigger signal to a simulation module 108 that can perform operations under phase 2. In this patent document, the terms "phase 1" and "phase 2" are used to describe separate operations performed by different modules of the vehicle simulation computer 102. Unless otherwise mentioned in this patent document, the terms "phase 1" and "phase 2" do not imply an order of operations between the different modules of the vehicle simulation computer 102. In some embodiments, the operations related to phase 2 can be performed before or with the operations performed by the trigger controller module 106 and/or scenario database 104 in phase 1.

In phase 2, the vehicle simulation computer 102 can operate the simulation module 108 and the vehicle software system module 110. The simulation module 108 provides simulated data to the vehicle software system module 110. Simulated data can include simulation parameter(s) about simulated object(s) located around the autonomous vehicle 120 that can be used to test the autonomous vehicle's performance. Simulated data can also include configurations about how other simulated objects move (e.g., the position, rotation and/or velocity of other objects) after simulation starts. As an example, the simulation parameters can include positions of simulated vehicles located and/or driven around the autonomous vehicle 120. In another example, a simulation parameter can include a simulated vehicle located on an on-ramp of a highway that will merge onto a lane where the autonomous vehicle 120 is being driven. In some embodiments, the simulation module 108 can obtain the simulation parameters about objects located around the autonomous vehicle 120 from the pre-configured scenario that the trigger controller module 106 receives from the scenario database 104. The simulated data configurations can be sent to the simulation module 108 by trigger controller module 106, where the trigger controller module 106 receives such information them from scenario database 104.

The simulation module 108 receives as an input vehicle status information 118 (e.g., current speed and/or location/position) from the autonomous vehicle 120. The simulation module 108 can transform the vehicle status information 118 to simulation environment. For example, a pre-configured scenario can indicate an initial condition of the autonomous vehicle and how other simulated objects may move around the autonomous vehicle 120. The initial condition may include a position of the autonomous vehicle 120. For example, a pre-configured scenario may include an initial condition where an autonomous vehicle 120 is being driven on a highway on ramp on Interstate 10 (I-10 freeway).

However, a benefit of the exemplary hybrid simulation system is that the autonomous vehicle 120 need not be driven on the I-10 freeway to test the pre-configured scenario.

In the hybrid simulation system, the autonomous vehicle 120 can be tested in a test facility anywhere in the real-world. For example, the autonomous vehicle 120 can be tested in a test facility in the State of Montana, which is located far from the I-10 freeway. In this example, the vehicle status information 118 may send global positioning system (GPS) data to the simulation module 108 that indicates that the autonomous vehicle 120 is located within Montana. The simulation module 108 can transform the vehicle status information 118 (e.g., GPS data) to change the position and/or rotation information to a location of an on ramp on the I-10 freeway. The simulation module 108 may perform a coordinate transformation to change the GPS data. For example, a simulation module 108 may calculate a coordinate transformation matrix by using the position of the autonomous vehicle described in the initial condition and the GPS data obtained at the beginning of phase 2.

The vehicle status information 118 received by the simulation module 108 can also indicate a response of the autonomous vehicle 120 to the simulation parameter(s). For example, if a simulation parameter indicates that a simulated vehicle located 80 meters in front of the autonomous vehicle 120 has stopped, then the vehicle status information 118 can indicate to the simulation module 108 that the autonomous vehicle has engaged its brakes to stop prior to reaching the simulated vehicle. The pre-configured scenario also includes the expected performance metrics for the autonomous vehicle 120. The expected performance metric can include the status information provided by the autonomous vehicle 120. For example, a pre-configured scenario's expected performance metric may state that when the autonomous vehicle stops it should not more than a pre-determined distance (e.g., 20 feet) from another simulated vehicle in front of the autonomous vehicle 120. Thus, the pre-configured scenario can include an expected performance metric or an expected output or an expected response from an autonomous vehicle to compare the actual response of the autonomous vehicle 120 in a simulation.

Continuing with the first of the two examples provided above, an expected response in the first pre-configured scenario can include a braking indicator that is set to a value (e.g., a brake flag set to a value "1") that indicates that the autonomous vehicle should engage its brakes. If the autonomous vehicle 120 brakes, it can send the vehicle status information 118 that includes the braking indicator value (e.g., value of "1"). The simulation module 108 can compare the expected breaking parameter in the expected output to the actual breaking indicator value received in the vehicle status information 118. If the simulation module 108 determines that the expected response from the autonomous vehicle 120 matches or is the same as an expected output, then the simulation module 108 can determine that the autonomous vehicle 120 has passed the simulation because the autonomous vehicle 120 has performed a correct operation in response to a simulation performed on the autonomous vehicle 120.

In the second of the two examples provided above, an expected performance metric in the second pre-configured scenario can include a distance measured by the autonomous vehicle 120 between the autonomous vehicle 120 and the simulated vehicle in front of the autonomous vehicle 120. In some embodiments, the simulation module 108 can determine that the autonomous vehicle 120 has passed a simulation if the simulation module 108 determines that an actual response value received from the autonomous vehicle 120 is within a range of expected response values provided by the pre-configured scenario. In some embodiments, the simulation module 108 can determine that the autonomous vehicle 120 has passed a simulation if the simulation module 108 determines that an actual response value received from the autonomous vehicle 120 is greater than an expected response value.

On the other hand, if the simulation module 108 determines that the expected response from the autonomous vehicle 120 does not matches the expected output or is not the same as the expected output, or is not within a range of expected response values, then the simulation module 108 can determine that the autonomous vehicle 120 has failed the simulation.

The vehicle software system module 110 includes the software code that can operate the autonomous vehicle 120. For example, the vehicle software system module 110 can include a perception algorithm module and a control algorithm module. The perception algorithm module can determine the presence of vehicle and/or objects located around the autonomous vehicle 120 based on the simulated data provided by the simulation module 108. The control algorithm module can control the driving operation of the autonomous vehicle in response to the information generated by the perception module. Thus, for example, the control algorithm module can generate and provide the control signal(s) 116 to operate the autonomous vehicle 120. The information included in the control signal(s) 116 may be the same as the information included in the control signal(s) 112 sent by the trigger controller module 106.

The hybrid simulation system 100 can be considered an augmented reality system, where the autonomous vehicle 120 is operating or being driven in the real-world, and where the software operating on the vehicle simulation computer 102 simulates scenarios to test the performance or operation of the autonomous vehicle 120. Continuing with the example described above, a simulation module 108 may simulate a presence of a stopped car 50 meters in front of the autonomous vehicle 120 so that the vehicle software system module 110 can perform operations to decelerate and stop the autonomous vehicle 110 in response to determining the presence of the stopped car. The autonomous vehicle 120 can be located in an empty test facility but can perform its operations as if it were operating in the real-world. Thus, a benefit of the hybrid simulation system 100 is that it can safely simulate scenarios to test the operations and/or performance of the autonomous vehicle 120. Another benefit of the hybrid simulation system 100 is that it can test both the software system and the hardware system operating on an autonomous vehicle 120. Yet another benefit of the hybrid simulation system 100 is that it can be performed during an integration process to test new autonomous vehicles to determine whether the new autonomous vehicles are ready for operation in the real-world. Finally, another benefit of the hybrid simulation system 100 is that it can allow engineers to fine tune the hardware and/or software for the autonomous vehicle in response to performing the hybrid simulation.

Figure 2:
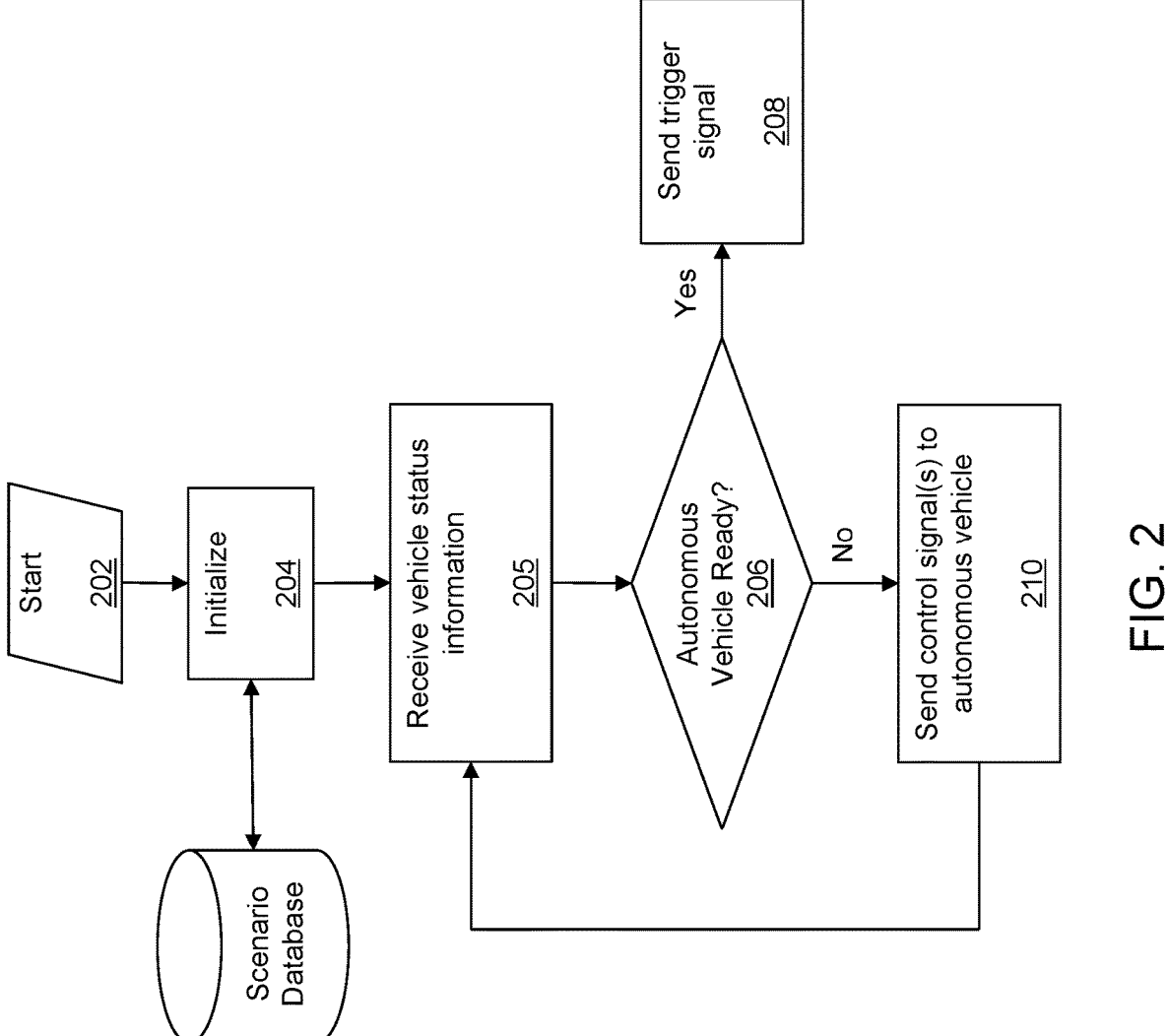
FIG. 2 shows an exemplary flow diagram of operations performed by a trigger controller module of a vehicle simulation computer.

FIG. 2 shows an exemplary flow diagram of operations performed by a trigger controller module of a vehicle simulation computer. At the start operation 202, a vehicle simulation computer receives an indication via a graphical user interface (GUI) that a user has initiated a simulation. The indication can include a pre-configured scenario selected by the user for the simulation. At the initialize operation 204, the vehicle simulation computer retrieves or receives the selected pre-configured scenario from the scenario database. From the pre-configured scenario, the vehicle simulation computer can determine an initial condition of the autonomous vehicle.

At the receiving operation 205, the vehicle simulation computer requests and/or receives the current vehicle status information from the autonomous vehicle so that the vehicle simulation computer can perform the determining operation 206 based on the latest status of the autonomous vehicle. After the receiving operation 205, the vehicle simulation computer performs the determining operation 206 where the vehicle simulation computer determines whether the autonomous vehicle has reached the initial condition specified by the selected pre-configured scenario. At the determining operation 206, if the vehicle simulation computer determines that the autonomous vehicle has reached the initial condition, then the trigger controller module of the vehicle simulation computer can generate and/or send a trigger signal to the simulation module to performs operations associated with phase 2 of the simulation process.

At the determining operation 206, if the vehicle simulation computer determines that the autonomous vehicle has not reached the initial condition, then the vehicle simulation computer performs the sending operation 210. At the sending operation 210, the vehicle simulation computer determines value(s) for control signal(s) that need to be sent to the autonomous vehicle to have the autonomous vehicle operate at the initial condition. The control signal(s) value(s) can be determined by the vehicle simulation computer by comparing the initial condition values (e.g., target speed) of autonomous vehicle with the vehicle status information that indicates a current status (e.g., current speed) of the autonomous vehicle. At the sending operation 210, the vehicle simulation computer sends the determined control signal(s) to the autonomous vehicle. After the sending operation 210, the vehicle simulation computer performs the receiving operation 205 and the determining operation 206.

FIG. 3 shows an exemplary flow diagram for testing autonomous vehicle operations. At the receiving operation 302, a vehicle simulation computer receives a pre-configured scenario. The pre-configured scenario includes one or more simulation parameters that indicate presence of one or more simulated objects in an environment that includes an autonomous vehicle, and one or more initial condition parameters that indicate an operative condition in which the autonomous vehicle is to be operated when a simulation is performed to test the autonomous vehicle.

At the sending operation 304, the vehicle simulation computer sends, to the autonomous vehicle and based on the one or more initial condition parameters, control signals that instruct the autonomous vehicle to operate at the operative condition.

At the determining operation 306, the vehicle simulation computer determines that the autonomous vehicle is operating at the operative condition and then performs operations 308 to 312. At the performing operation 308, the vehicle simulation computer performs, based on the one or more simulation parameters, the simulation with the one or more simulated objects and the autonomous vehicle. At the receiving operation 310, the vehicle simulation computer receives, from the autonomous vehicle, a status information that indicates a response of the autonomous vehicle to the simulation with one or more simulated objects. At the determining operation 312, the vehicle simulation computer determines that the autonomous vehicle passed the simulation based on a comparison of the response of the autonomous vehicle to an expected response of the autonomous vehicle. In some embodiments, when the vehicle simulation computer determines that the autonomous vehicle has passed (or failed) the simulation, the vehicle simulation computer (e.g., simulation module) can send a message to be displayed on the vehicle simulation computer, where the message indicates that the autonomous vehicle has passed (or failed) the simulation.

In some embodiments, the vehicle simulation computer determines that the autonomous vehicle is operating at the operative condition by: receiving, from the autonomous vehicle, another status information that indicates a current driving condition of the autonomous vehicle, and determining that that the current driving condition is same as the operative condition. In some embodiments, the method further comprises the vehicle simulation computer resending the control signals to the autonomous vehicle in response to determining that the autonomous vehicle is not operating at the operative condition.

In some embodiments, the one or more simulation parameters that indicate presence of the one or more simulated objects include a first set of one or more locations of one or more vehicles or a second set of one or more locations of one or more pedestrians. In some embodiments, the one or more initial condition parameters include a position, a rotation, a speed (linear and/or angular), or an acceleration of the autonomous vehicle. In some embodiments, the control signals include a steering angle that controls an amount of steering of the autonomous vehicle, a throttle value that controls a speed of the autonomous vehicle, a brake value to control an amount of braking engaged by the autonomous vehicle, a clutch indication to press or release the clutch of the autonomous vehicle, or a gear shifting information to switch engine gears of the autonomous vehicle. In some embodiments, the autonomous vehicle is a semi-trailer truck.

For cases where the autonomous vehicle is a semi-trailer truck, the simulation parameters may be designed to test the cab portion separately from the trailer portion. For example, a same cab may be paired with different trailers and therefore simulations may be performed on using different combinations of semi (cabs) and trailers. Thus, for example, simulation parameters that indicate a presence of an object designed to veer into a lane occupied by and in front of the semi-trailer truck can be used to test the response of the cab portion separately from the trailer portion at least because different trailer lengths can have a different response to evasive maneuvering by a cab portion. The response of the cab portion and the trailer portion can be obtained from their respective sensors (e.g., accelerometers).

Figure 4:
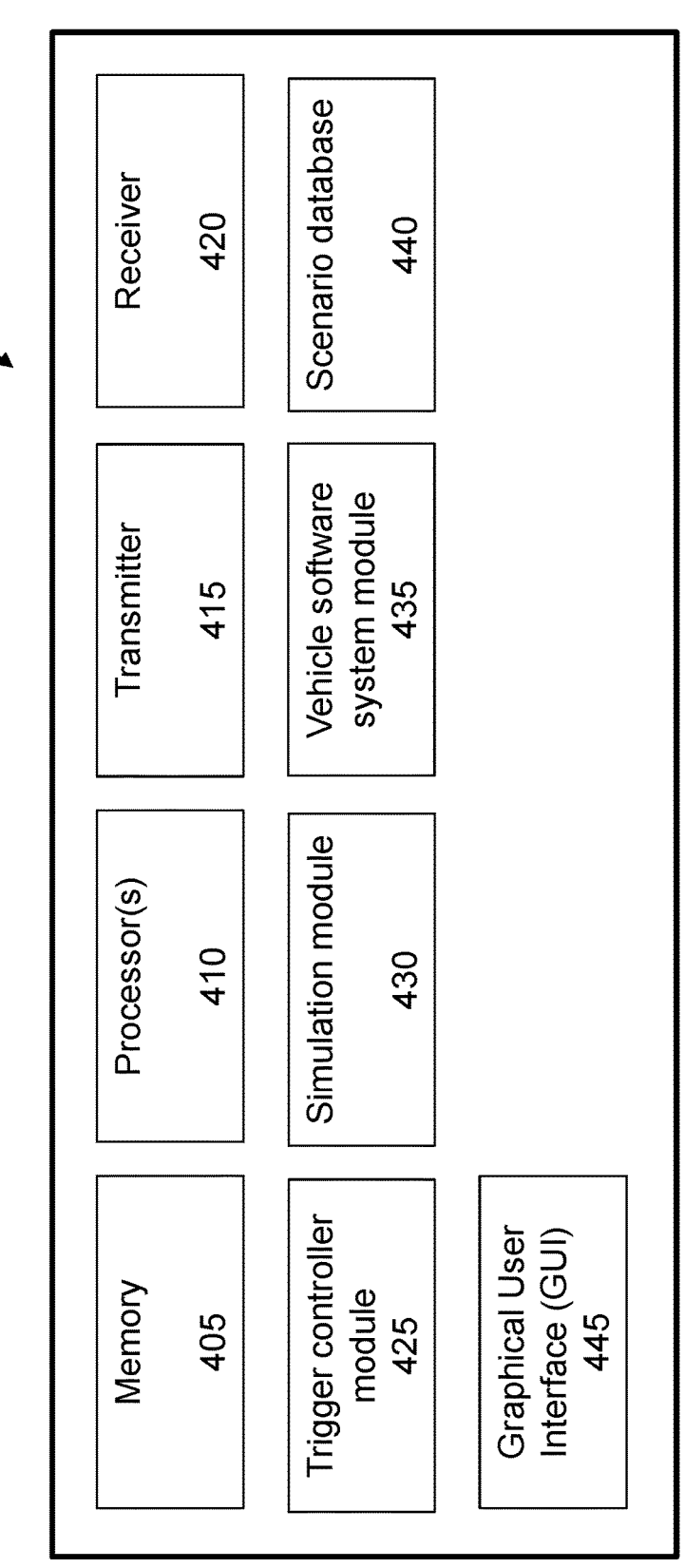
FIG. 4 shows an exemplary block diagram of a vehicle simulation computer.

FIG. 4 shows an exemplary block diagram of a vehicle simulation computer. The vehicle simulation computer 400 includes at least one processor 410 and a memory 405 having instructions stored thereupon. The instructions upon execution by the processor 410 configure the computer 400 to perform the operations described for the various modules, GUI, and/or database as described in FIGS. 1 to 3 and 5, and/or the operations described in the various embodiments or sections in this patent document.

In this document the term "exemplary" is used to mean "an example of" and, unless otherwise stated, does not imply an ideal or a preferred embodiment.

From the foregoing, it will be appreciated that specific embodiments of the technical description have been described herein for purposes of illustration, but that various modifications may be made without deviating from the scope of the technical description. Accordingly, the technical description is not limited except as by the appended claims.

Some of the embodiments described herein are described in the general context of methods or processes, which may be implemented in one embodiment by a computer program product, embodied in a computer-readable medium, including computer-executable instructions, such as program code, executed by computers in networked environments. A computer-readable medium may include removable and non-removable storage devices including, but not limited to, Read Only Memory (ROM), Random Access Memory (RAM), compact discs (CDs), digital versatile discs (DVD), etc. Therefore, the computer-readable media can include a non-transitory storage media. Generally, program modules may include routines, programs, objects, components, data structures, etc. that perform particular tasks or implement particular abstract data types. Computer- or processor-executable instructions, associated data structures, and program modules represent examples of program code for executing steps of the methods disclosed herein. The particular sequence of such executable instructions or associated data structures represents examples of corresponding acts for implementing the functions described in such steps or processes.

Some of the disclosed embodiments can be implemented as devices or modules using hardware circuits, software, or combinations thereof. For example, a hardware circuit implementation can include discrete analog and/or digital components that are, for example, integrated as part of a printed circuit board. Alternatively, or additionally, the disclosed components or modules can be implemented as an Application Specific Integrated Circuit (ASIC) and/or as a Field Programmable Gate Array (FPGA) device. Some implementations may additionally or alternatively include a digital signal processor (DSP) that is a specialized microprocessor with an architecture optimized for the operational needs of digital signal processing associated with the disclosed functionalities of this application. Similarly, the various components or sub-components within each module may be implemented in software, hardware or firmware. The connectivity between the modules and/or components within the modules may be provided using any one of the connectivity methods and media that is known in the art, including, but not limited to, communications over the Internet, wired, or wireless networks using the appropriate protocols.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few implementations and examples are described and other implementations, enhancements and variations can be made based on what is described and illustrated in this disclosure.

What is claimed is:

1. A method of testing vehicle operation, comprising:
receiving, by a computer in a vehicle, a set of parameters that indicates a presence of a simulated object in a simulation to be performed with the vehicle, wherein the set of parameters indicates a condition in which the vehicle is to be operated when the simulation is performed;
receiving, prior to performing the simulation, a first status information that indicates a first status of the vehicle;
determining, prior to performing the simulation, that the vehicle is not operating at the condition based on the first status information; and
causing the vehicle to operate in the condition by:
controlling at least one of an amount of steering of the vehicle, a speed or an acceleration of the vehicle, an amount of braking or deceleration engaged by the vehicle, a state of a clutch of the vehicle, or switching of engine gears of the vehicle by sending, prior to performing the simulation and in response to the determining, one or more control signals based on the set of parameters.

2. The method of claim 1, further comprising:
receiving, by the computer, a second status information that indicates a second status of the vehicle;
determining that the vehicle is operating at the condition based on the second status information; and
performing the simulation with the simulated object in response to determining that the vehicle is operating at the condition.

3. The method of claim 2, wherein the performing the simulation comprises:
obtaining simulated data that includes a configuration of the simulated object;
receiving, from the vehicle, a third status information that indicates a response of the vehicle to the simulation with the simulated object; and
determining that the vehicle passed the simulation by comparing the response of the vehicle to an expected response of the vehicle.

4. The method of claim 3, wherein the configuration of the simulated object includes information about movement of the simulated object.

5. The method of claim 3, wherein the third status information indicates that the vehicle has applied brakes to stop prior to reaching the simulated object in response to a parameter in the set of parameters indicating that the simulated object located in front of the vehicle has stopped.

6. The method of claim 3,
wherein the vehicle is determined to pass the simulation in response to determining that a value indicated in the response of the vehicle is the same as that in the expected response of the vehicle, and
wherein the expected response is included in the set of parameters.

7. The method of claim 3,
wherein the vehicle is determined to pass the simulation in response to determining that a value indicated in the response of the vehicle is in between a range of values of the expected response of the vehicle, and
wherein the expected response is included in the set of parameters.

8. A non-transitory computer readable program storage medium having code stored thereon, the code, when executed by a processor of a computer on a vehicle, causing the computer to implement a method comprising:
receiving a set of parameters that indicates a presence of a simulated object in a simulation to be performed with the vehicle, wherein the set of parameters indicates a condition in which the vehicle is to be operated when the simulation is performed;
receiving, prior to performing the simulation, a first status information that indicates a first status of the vehicle;
determining, prior to performing the simulation, that the vehicle is not operating at the condition based on the first status information; and
causing the vehicle to operate in the condition by:
controlling at least one of an amount of steering of the vehicle, a speed or an acceleration of the vehicle, an amount of braking or deceleration engaged by the vehicle, a state of a clutch of the vehicle, or switching of engine gears of the vehicle by sending, prior to performing the simulation and in response to the determining, one or more control signals based on the set of parameters.

9. The non-transitory computer readable program storage medium of claim 8, wherein the one or more control signals include a throttle value that controls the speed or the acceleration of the vehicle.

10. The non-transitory computer readable program storage medium of claim 8, wherein the one or more control signals include a brake value that controls the amount of braking or deceleration engaged by the vehicle.

11. The non-transitory computer readable program storage medium of claim 8, wherein the set of parameters is received in response to receiving an indication via a graphical user interface (GUI) of a pre-configured scenario that is selected, wherein the pre-configured scenario includes the set of parameters.

12. The non-transitory computer readable program storage medium of claim 8, wherein a value corresponding to a control signal from the one or more control signals is determined by comparing a first value from the first status information related to a parameter with a second value from the set of parameters related to the parameter.

13. An apparatus for testing vehicle operation, comprising:
a computer comprising at least one processor configured to:
receive a set of parameters that indicates a presence of a simulated object in a simulation to be performed with a vehicle, wherein the set of parameters indicates a condition in which the vehicle is to be operated when the simulation is performed;
receive, prior to performing the simulation, a first status information that indicates a first status of the vehicle;
determine, prior to performing the simulation, that the vehicle is not operating at the condition based on the first status information; and
cause the vehicle to operate in the condition by:
controlling at least one of an amount of steering of the vehicle, a speed or an acceleration of the vehicle, an amount of braking or deceleration engaged by the vehicle, a state of a clutch of the vehicle, or switching of engine gears of the vehicle by sending, prior to performing the simulation and in response to the determine, one or more control signals based on the set of parameters.

14. The apparatus of claim 13, wherein the one or more control signals include a steering angle that controls the amount of steering of the vehicle.

15. The apparatus of claim 13, wherein the at least one processor is further configured to:

receive, by the computer, a second status information that indicates a second status of the vehicle;

determine that the vehicle is operating at the condition based on the second status information; and perform the simulation with the simulated object in response to determining that the vehicle is operating at the condition.

16. The apparatus of claim 15, wherein the simulation is performed by the at least one processor configured to:

obtain simulated data that includes a configuration of the simulated object;

receive, from the vehicle, a third status information that indicates a response of the vehicle to the simulation with the simulated object; and determine that the vehicle passed the simulation by comparing the response of the vehicle to an expected response of the vehicle.

17. The apparatus of claim 16, wherein the configuration of the simulated object includes information about movement of the simulated object.

18. The apparatus of claim 17, wherein the third status information indicates that the vehicle has applied brakes to stop prior to reaching the simulated object in response to a parameter in the set of parameters indicating that the simulated object located in front of the vehicle has stopped.

19. The apparatus of claim 17, wherein the vehicle is determined to pass the simulation in response to a determination that a value indicated in the response of the vehicle is the same as that in the expected response of the vehicle, and wherein the expected response is included in the set of parameters.

20. The apparatus of claim 17, wherein the vehicle is determined to pass the simulation in response to a determination that a value indicated in the response of the vehicle is in between a range of values of the expected response of the vehicle, and wherein the expected response is included in the set of parameters.

\* \* \* \* \*